(12) United States Patent
Head (10) Patent No.: US 9,635,771 B2
(45) Date of Patent: Apr. 25, 2017

(54) MEDIA DRAWER

(71) Applicant: Gene Head, Windermere, FL (US)

(72) Inventor: Gene Head, Windermere, FL (US)

( * ) Notice: Subject to any disclaimer, the term of this patent is extended or adjusted under 35 U.S.C. 154(b) by 0 days.

(21) Appl. No.: 14/478,495

(22) Filed: Sep. 5, 2014

(65) Prior Publication Data

US 2015/0070867 A1 Mar. 12, 2015

Related U.S. Application Data

(60) Provisional application No. 61/880,447, filed on Sep. 20, 2013, provisional application No. 61/874,416, filed on Sep. 6, 2013.

(51) Int. Cl.
*H05K 5/02* (2006.01)
*A47B 88/00* (2006.01)
*A47B 67/04* (2006.01)

(52) U.S. Cl.
CPC ....... *H05K 5/0217* (2013.01); *A47B 88/0044* (2013.01); *A47B 67/04* (2013.01)

(58) Field of Classification Search
CPC ....... A47B 67/005; A47B 67/04; A47B 79/00; A47B 81/06; A47B 46/00; A47B 88/0055; A47B 88/0051; A47B 88/0044; A47B 2088/0011; A47B 2210/08; A47B 2210/01; A47B 2210/17; A47B 2210/175
USPC .......................................................... 312/323
See application file for complete search history.

(56) References Cited

U.S. PATENT DOCUMENTS

| 443,350 | A | * | 12/1890 | Berners | E05D 15/38 312/323 |
|---|---|---|---|---|---|
| 463,150 | A | * | 11/1891 | Graves | F24C 15/023 126/191 |
| 479,857 | A | * | 8/1892 | Tettelbach | F24C 15/02 126/18 |
| 968,719 | A | | 8/1910 | Warsop | |
| 1,879,798 | A | * | 9/1932 | Ferris | E05D 15/425 49/206 |
| 2,172,605 | A | * | 9/1939 | Bourn | A47B 85/06 312/208.3 |
| 2,189,233 | A | * | 2/1940 | Vanderveld | E06B 3/5045 16/85 |

(Continued)

FOREIGN PATENT DOCUMENTS

EP 2368463 A2 9/2011

OTHER PUBLICATIONS

International Search Report mailed on Dec. 31, 2014 in PCT/US2014/054272 (2 pages).

(Continued)

*Primary Examiner* — Andrew Roersma
(74) *Attorney, Agent, or Firm* — Stephen E. Kelly; Hill Ward Henderson, P.A.

(57) ABSTRACT

A dual-functioning drawer for a case piece of furniture that can transition from an enclosed drawer to an open media shelf for storing electronic components or devices. The drawer front is affixed to the drawer sides with brackets that rotate about a pivot point to rotate the drawer front from a vertical position to a horizontal position such that the drawer front rests on top of the drawer sides and is receded in the case piece. The drawer may also include an angled display panel for storing and charging electronic devices and cutouts for managing cords within the drawer.

14 Claims, 5 Drawing Sheets

(56) References Cited

U.S. PATENT DOCUMENTS

| | | | | |
|---|---|---|---|---|
| 2,301,856 | A * | 11/1942 | Conwell | E06B 3/385 16/374 |
| 2,775,501 | A * | 12/1956 | Kyllo | A47B 95/02 312/303 |
| 3,404,930 | A | 10/1968 | Cafiero et al. | |
| 4,739,887 | A * | 4/1988 | Beach | H01H 9/025 211/187 |
| 5,445,452 | A * | 8/1995 | Kauffman | F25D 23/04 312/321.5 |
| 5,615,624 | A | 4/1997 | Terry et al. | |
| 5,802,991 | A | 9/1998 | Brown et al. | |
| 5,947,573 | A * | 9/1999 | Tovar | A47B 88/0003 312/311 |
| 6,844,494 | B1 * | 1/2005 | Nevins | H01R 25/003 174/135 |
| 7,458,689 | B2 * | 12/2008 | Head | A47B 81/06 248/917 |
| 7,721,660 | B1 | 5/2010 | Davis | |
| 7,868,250 | B2 * | 1/2011 | Kolada | H01R 13/60 174/135 |
| 2005/0057128 | A1 | 3/2005 | Anderson et al. | |
| 2006/0075550 | A1 * | 4/2006 | Hanson | A47B 21/0073 5/53.1 |
| 2008/0088214 | A1 * | 4/2008 | Debonis | A47B 67/005 312/348.4 |
| 2009/0158973 | A1 * | 6/2009 | Felterman | A47B 21/03 108/102 |
| 2010/0257892 | A1 * | 10/2010 | Lee | F25D 23/04 62/449 |
| 2012/0205497 | A1 * | 8/2012 | Hunt | A47B 46/00 248/49 |
| 2013/0127306 | A1 | 5/2013 | Head | |
| 2013/0257236 | A1 | 10/2013 | Head | |

OTHER PUBLICATIONS

Written Opinion mailed on Dec. 31, 2014 in PCT/US2014/054272 (5 pages).

* cited by examiner

MEDIA DRAWER

This application claims the benefit of U.S. Provisional Application No. 61/874,416, filed Sep. 6, 2013 and U.S. Provisional Application No. 61/880,447, filed Sep. 20, 2013, the disclosures of which are expressly incorporated herein by reference.

BACKGROUND

The present invention is directed towards a safe, economical, and aesthetically pleasing means for providing a dual functioning storage drawer and media shelf in a case piece of furniture, such as a dresser or nightstand.

A vast majority of consumers in the United States have a television in their master bedroom. Such televisions are typically used in conjunction with many electronic components, including but not limited to, cable boxes, DVD players, DVR players, and satellite receivers. Many consumers struggle to find a convenient and aesthetically pleasing location for such components in the bedroom. Some consumers end up storing the components on top of items of furniture, such as a dresser or chest that is adjacent to the television. This exudes a cluttered and disorganized appearance that is not aesthetically pleasing. Some consumers would prefer to have a way to store the electronic components within the item of furniture instead of on top of it. However, some other consumers would prefer to maximize the enclosed storage space within the furniture (i.e., drawers and cabinets) and, therefore, not have any open spaces for storing electronic components. That is particularly the case for consumers who don't have a television in the bedroom.

Similarly, in the case of nightstands, many consumers use the drawers as storage drawers for books and other items. Many consumers also tend to charge their cell phones and tablets next to their bed by plugging the chargers in the wall outlets and laying the devices on top of the nightstand. This can leave a cluttered look on top of the nightstand, and it takes away from space that may otherwise be used for items such as lamps and photographs. Additionally, when valuable electronic devices are laid on top of a nightstand, for example, they are prone to spillage of beverages that the consumer may have set on the nightstand. If consumers choose to charge the devices while in a drawer of the nightstand, the devices are less accessible and the charger cords typically hang out of the drawer as they extend to the wall outlet, thereby producing an undesirable visual effect and leaving the cords subject to damage if the consumer inadvertently attempts to fully close the drawer.

The furniture industry has addressed the issue of electronic device storage in the bedroom in a very ineffective way. Particularly, there are four options from which consumers are able to choose today to solve this organizational dilemma. Yet, those options are fraught with issues, as explained below.

Some prior art items of furniture include an open cavity that forms a shelf on which media components can sit. The open cavity is usually substituted for one or more drawers and is typically found in dressers or media chests. Though the open cavity provides for storage and organization of electronic components, it creates a problem if the consumer does not have a need for storing electronic components, such as in the bedroom. In that case, the open cavity merely becomes a dust collector and wasted space which could have otherwise been used for covered storage, such as drawers for clothes.

Some other prior art case pieces of furniture include a cabinet with a glass door for storing electronic components, but these are not typically seen in bedroom furniture, especially if there is no need for storing components. Therefore, glass doors are not an aesthetically desired option for many consumers, and the functionality is pre-determined for use with storing components because most consumers are unwilling to store clothing in a glass-faced cabinet.

Some additional prior art items of furniture include a drop-down door that creates a faux drawer. The drop-down door works very similarly to the concept of draw bridges in that they usually have two unsightly hinges on each end that drop down along with the door. The drop-down door becomes an unsightly protrusion from the furniture when it is down. Also, such drop-down doors do not enable the consumer to have true drawer-type storage space because the drawer is not able to be pulled from and retracted into the case piece.

A different iteration of a prior art drop down door provides a working drawer for storage, yet the door is also capable of dropping down to reveal an open storage space for electronic components. While this option provides dual functionality, the typical six to eight inch protrusion of the drop down door is unsightly, and such protrusion could cause bodily injury, which raises significant product liability concerns for the manufacturers.

None of the foregoing options that are presently available in the marketplace address the need for a safe and aesthetically pleasing item of furniture having a drawer that can function as an extendible drawer that provides covered storage space or an open cavity for storage of electronic components. Thus, furniture manufacturers and retailers currently have no way for marketing the same items of furniture to both types of consumers—namely, those wanting open media shelves and those wanting maximized covered storage space for clothing, et cetera. It is not practical, nor does it make economic sense for the retailer to stock the same piece of furniture made in two different ways.

BRIEF SUMMARY OF THE PRESENT INVENTION

The present invention provides an item of furniture including a drawer that transitions between serving as an extendible drawer providing enclosed storage and an open cavity for storing electronic components and devices in a safe, economical, and aesthetically pleasing manner. Specifically, the present invention provides a media drawer for a case piece of furniture including a drawer front, a first drawer side and a second drawer side, a drawer bottom disposed between the first drawer side and the second drawer side, a first bracket affixed on one end to the drawer front and affixed on the other end to the first drawer side, and a second bracket affixed on one end to the drawer front and affixed on the other end to the second drawer side. The drawer front rests in a substantially vertical plane facing outward on the case piece of furniture when in an enclosed position, and the drawer front is configured to transition from the enclosed position to a receded position by rotating up such that the drawer front rests in a substantially horizontal plane on top of the first drawer side and the second drawer side. The media drawer is configured to extend away from and retract into the case piece and when the drawer front is in the receded position, no portion of the drawer front protrudes from the case piece.

A top corner of each of the first drawer side and second drawer side closest to a front of the case piece may be rounded or angled to facilitate smooth transition and rotation of the drawer front from the enclosed to receded positions. Also, the first bracket and second bracket may be L-brackets. In an embodiment, the first bracket has a first pivot point on the first drawer side, the second bracket has a second pivot point on the second drawer side, and the first pivot point and the second pivot point are more than halfway below a vertical midpoint of each of the first drawer side and second drawer side, respectively. When the media drawer front transitions from the enclosed position to the receded position, the first bracket and second bracket rotate about the first pivot point and second pivot point, respectively, to rotate the drawer front up such that it rests in a substantially horizontal plane on top of the first drawer side and second drawer side.

In another embodiment, the media drawer includes a first pin corresponding with a first pivot point for the first bracket on the first drawer side, a second pin corresponding with a second pivot point for the second bracket on the second drawer side, a first sliding track on the first drawer side, and a second sliding track on the second drawer side. When the drawer front is transitioned from the enclosed position to the receded position, the first pin and second pin slide up the first sliding track and second sliding track, respectively, such that the drawer front rests in a substantially horizontal plane on top of the first drawer side and the second drawer side. The first sliding track and the second sliding track may be in the shape of an inverted "L."

In another embodiment of the present invention, the media drawer further includes a display panel that is vertically angled and disposed between the drawer bottom and a top of the media drawer. The first drawer side may include a first panel track and the second drawer side may include a second panel track such that the display panel may be removably inserted in and held in position by the first panel track and the second panel track. The display panel may include at least one cutout for positioning cords associated with electronic devices that may be displayed on the display panel and a power strip may be affixed to an interior of the media drawer behind the display panel. The display panel may further include at least one outlet such as a standard 120 V electrical port or a USB port.

In yet a further embodiment, the media drawer may include an adjustable floor that rests in a substantially horizontal plane above the drawer bottom to form an open cavity between the drawer bottom and the adjustable floor. The first drawer side and the second drawer side may include at least one set of floor tracks that are configured to removably receive and hold in position the adjustable floor. A display panel may be provided that is vertically angled between the adjustable floor and a top of the media drawer.

The case piece of furniture of the present invention may be a dresser, nightstand, entertainment center, television console, or chest of drawers.

DETAILED DESCRIPTION THE PRESENT INVENTION

As shown in the Figures, the media drawer 100 of the present invention provides an economical, safe, an aesthetically pleasing way for functioning as either an enclosed storage drawer or an open electronic component storage cavity within the same case piece of furniture. Particularly, in a matter of seconds, the consumer is able to transition the media drawer between the two functions.

Referring now to FIGS. 1-2 and 5-6, the media drawer 100 of the present invention may be housed in a case piece of furniture, such as a bedroom dresser or a nightstand. The media drawer 100 is similar to a typical box drawer that is capable of being extended (pulled open) and retracted, and is used to store clothing, books, and other items desired by the consumer.

Figure 1:
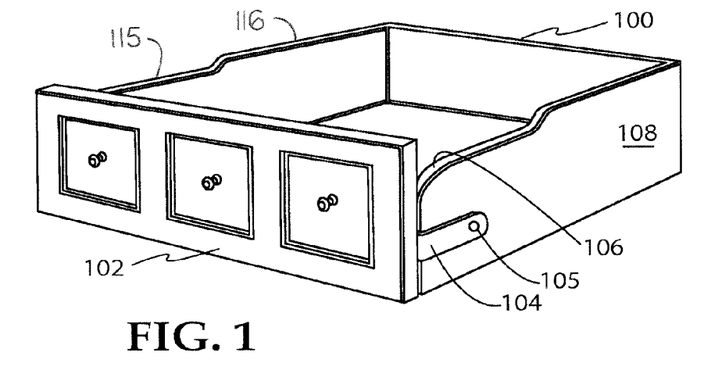
FIGS. 1-2 are images of an embodiment of the media drawer of the present invention transitioning from a closed position to a retracted position.
Figure 2:
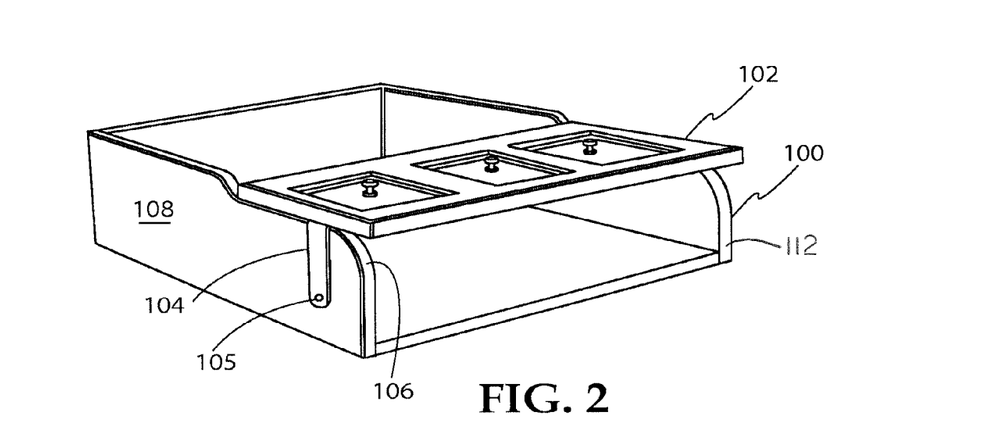

Unlike typical prior art drawers, the drawer front 102 on the media drawer 100 of the present invention is detachably affixed to the frame of the box-like drawer. Particularly, on each side of the drawer 100, a bracket 104 (such as an L-bracket) is attached on one end to the drawer front 102 and on the other end to the side panel 108 of the drawer 100. It should be understood that the brackets 104 may be affixed to any suitable positions on the drawer front 102 and the side panels 108. For example, the brackets 104 may be affixed to sides or rear of the drawer front 102 and may be affixed to the inside or outside of the side panels 108. Each bracket 104 has a pivot point 105 that allows the drawer front 102 to rotate up 90 degrees along a fixed arc to ultimately rest on top of the box-like frame of the drawer 100, as shown in FIG. 2. As shown in FIGS. 1-2, the top front corners of the drawer sides 108 are rounded 106 so that when the drawer front 102 is rotated up, the backside of the drawer front 102 does not rub against the edges of the drawer sides 108. This may also be achieved by angling 216 the top front corners or the drawer sides 108, as shown in the embodiment in FIG. 8. Referring again to FIGS. 1-2, in one embodiment of the drawer sides 108, the drawer sides 108 further comprise a front portion 112, a recessed portion 115, and a raised portion 116, where the top of the recessed portion 115 is lower than the top of the raised portion 116. When the drawer front 102 is placed in a receded position, such as that shown in FIG. 2, the drawer front 102 is seated in the recessed portion 115 such that the drawer front 102 remains substantially flush with the raised portion 116 and the front portion 112, thereby enabling a compact configuration of the media drawer 100 when the drawer front 102 is in the receded position. The pivot points 105 are preferably located more than halfway down the side panels 108 of the drawer 100, which enables the drawer front 102 to rotate up and recede into the case piece such that more than half of the drawer front 102 rests on the tops of the side panels 108, thereby eliminating the need for any type of closure to hold the drawer front 102 in place. Also, because the drawer front recedes the case piece, it does not cause an unsightly or dangerous protrusion from the case piece. When the drawer front 102 is receded into the case piece, the resulting open cavity creates a space wherein electronic components can be stored such that their faces are visible to receive remote control signals, as shown in FIG. 6.

Figure 3:
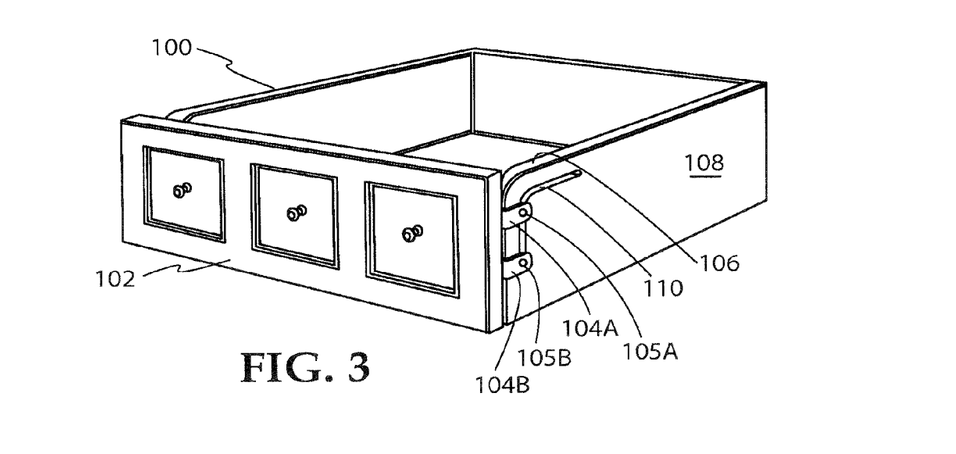
FIGS. 3-4 are images of a second embodiment of the media drawer of the present invention transitioning from a closed position to a retracted position.
Figure 4:
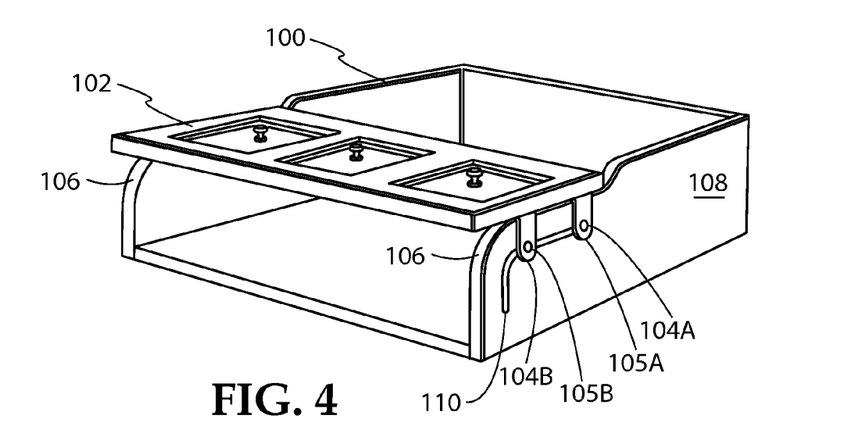

In an additional embodiment of the present invention, as shown in FIGS. 3-4, each drawer side 108 may utilize a pair of brackets (104A, 104B) to provide dual moving pivot points (105A, 105B respectively). Each pivot point (105A, 105B) of the respective brackets (104A, 104B) includes a pin (not shown) that forms a mating engagement with track 110 that may be a groove etched in the side panel 108. The track 110 may be in the shape of an inverted "L" as shown in the Figures. As the drawer front 102 rotates up to recede into the space above the drawer 100, the pins at the pivot points (205A, 105B) move along the track 100. While FIGS. 3-4 depict the use of a pair of brackets (104A, 104B) in connection with the track 110 on each side, it should be noted that one bracket having a single pivot point and corresponding pin on each side could also be utilized with the track 110. However, the dual brackets (104A, 104B) on each side may provide more stability and eliminate racking as the drawer front 102 recedes into the case piece.

Figure 5:
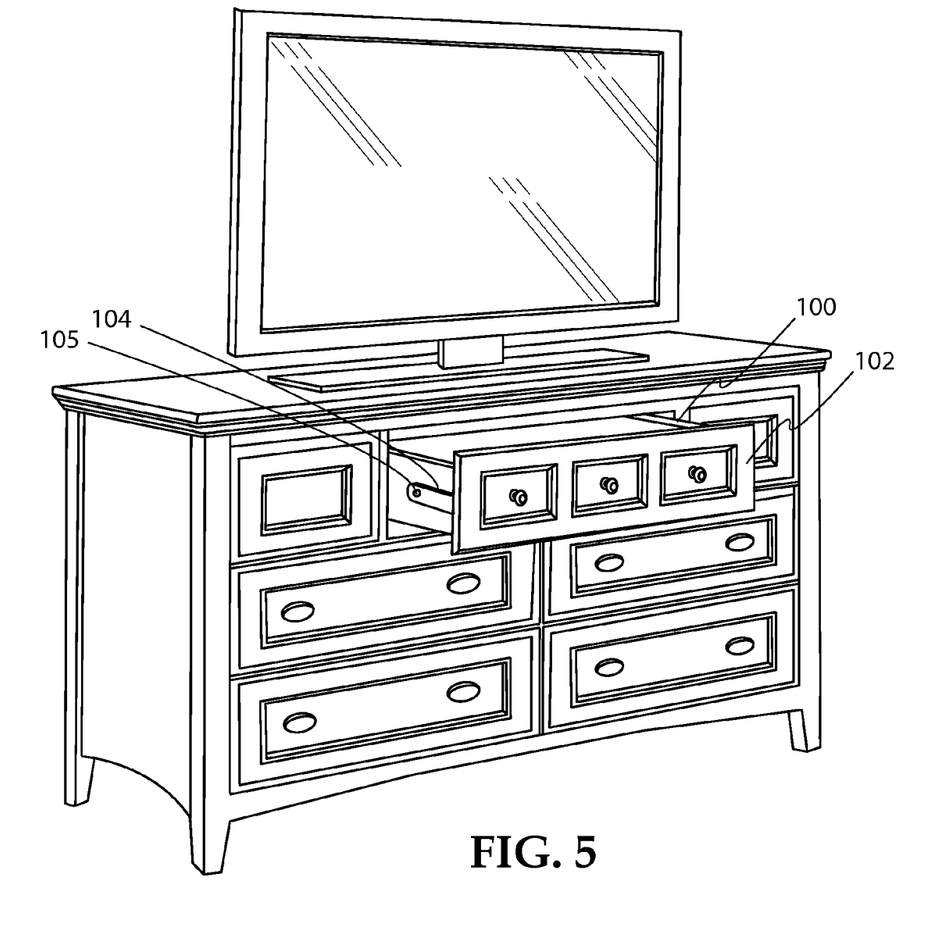
FIGS. 5-6 are images of a dresser incorporating the media drawer of the present invention.
Figure 6:
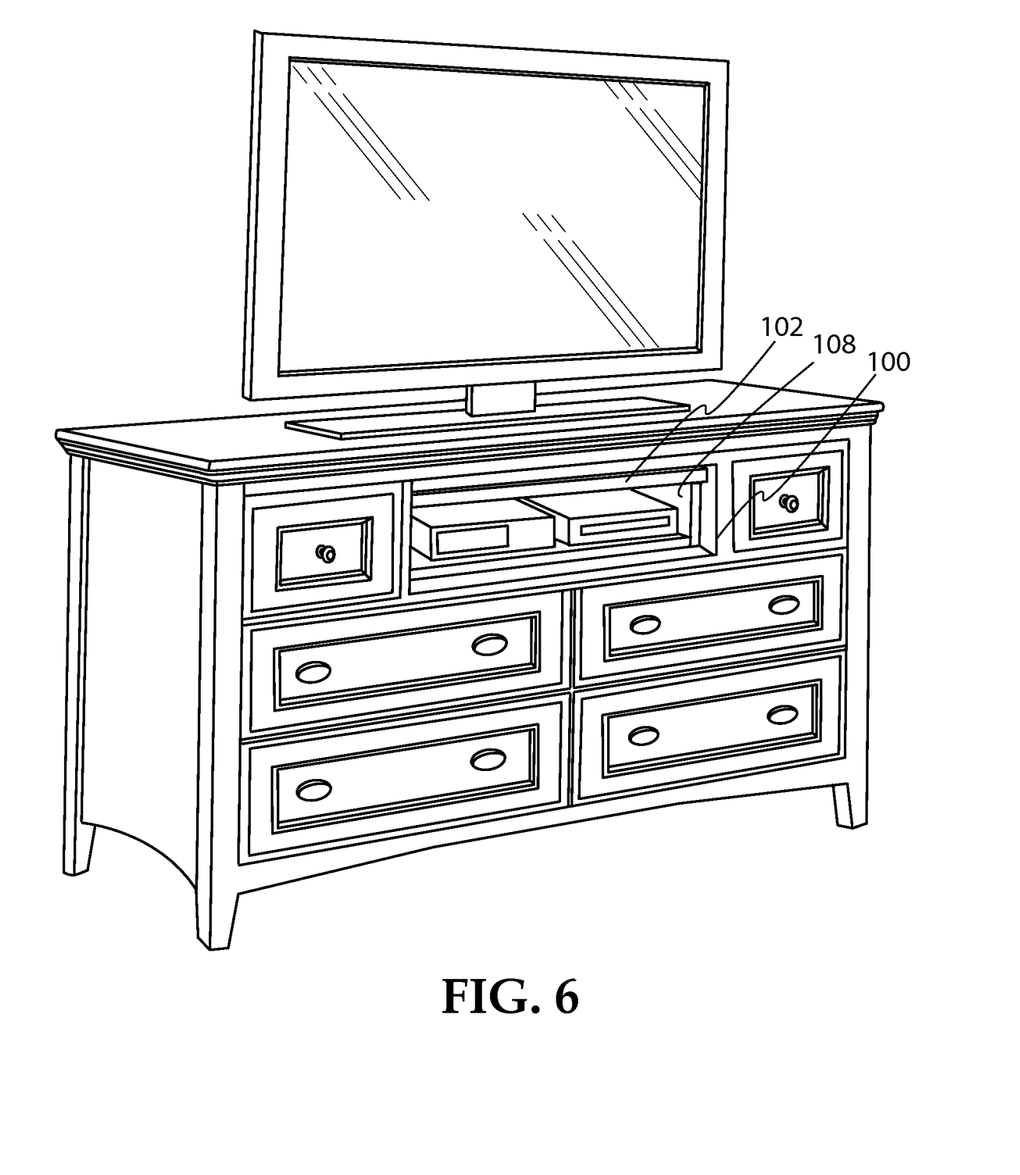

As shown in FIGS. 5-6, when the drawer front 102 is in an enclosed position, it may be used as a functional storage drawer that slides in and out of the case piece and is capable of storing items. When the consumer desires to transition the media drawer 100 from the enclosed position to a retracted position, he or she simply uses hand manipulation to rotate the drawer front 102 up to rest on top of the sides 108 of the drawer 100 and recede into the case piece, as explained above.

Figure 7:
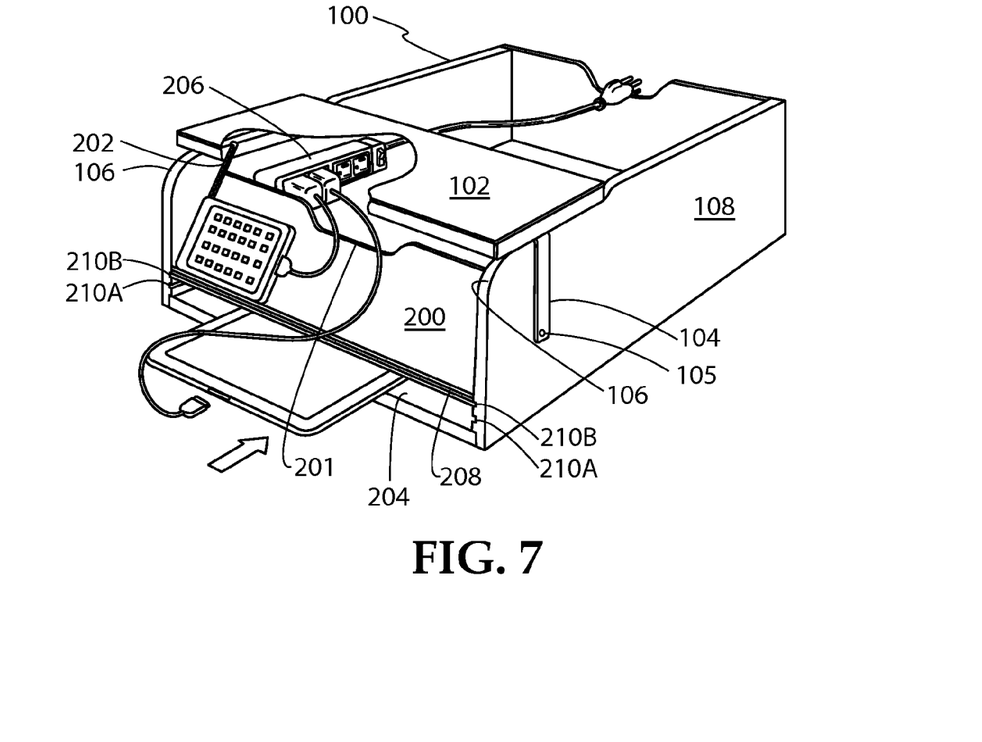
FIG. 7 is an image of a third embodiment of the media drawer of the present invention including a display panel.
Figure 9:
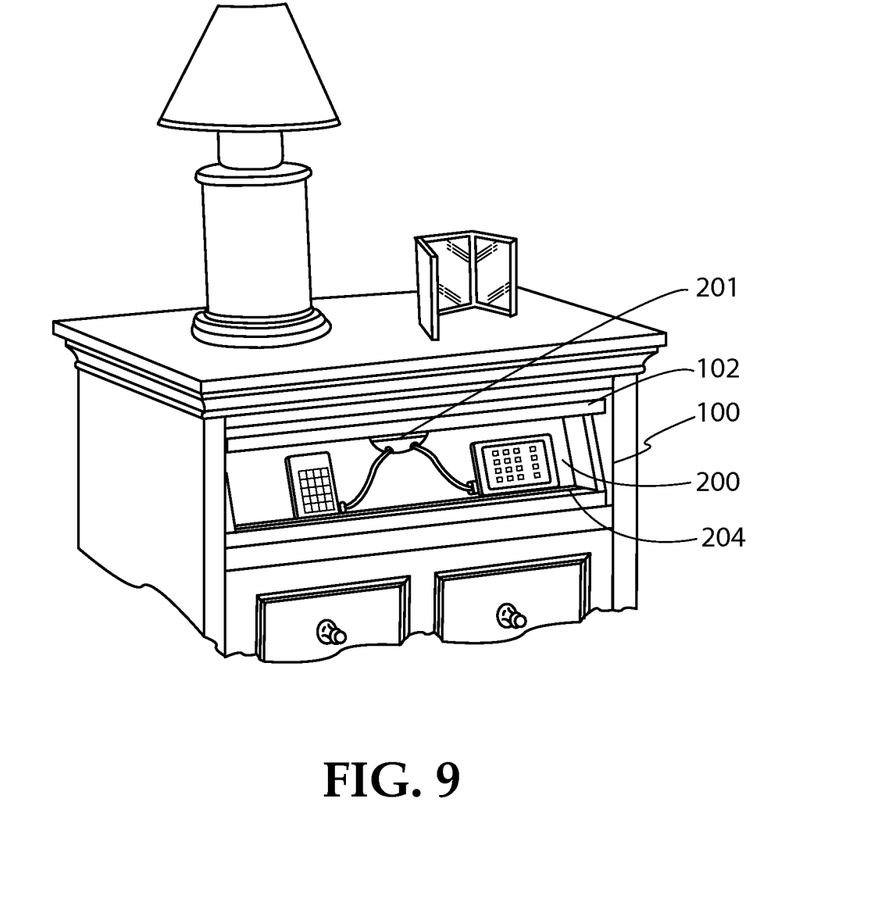
FIG. 9 is an image of a nightstand incorporating the media drawer of FIG. 7.

Referring now to FIG. 7, the media drawer 100 may also be configured to serve as a storage and charging drawer for personal electronic devices, such as in a nightstand as shown in FIG. 9. In this embodiment, the drawer front 102 rotates up and recedes into the case piece in the same way as described in FIGS. 1-2 or in FIGS. 3-4; however, in this embodiment the drawer 100 includes additional surface space for storage, charging, and display of devices such as cell phones and tablets. This is achieved by providing a slanted display panel 200 in the drawer 100 on which electronic devices may be displayed or rest. In one aspect of the embodiment, tracks 202 (which may be etched grooves) are provided on the interior of each side panel 108 of the drawer 100 such that the panel 200 may be removably slid into position. Thus, if the consumer doesn't have a need for a charging stand, the consumer can simply remove the panel 200 and use the drawer 100 as typical closed storage space or an open cavity, as described above.

Figure 8:
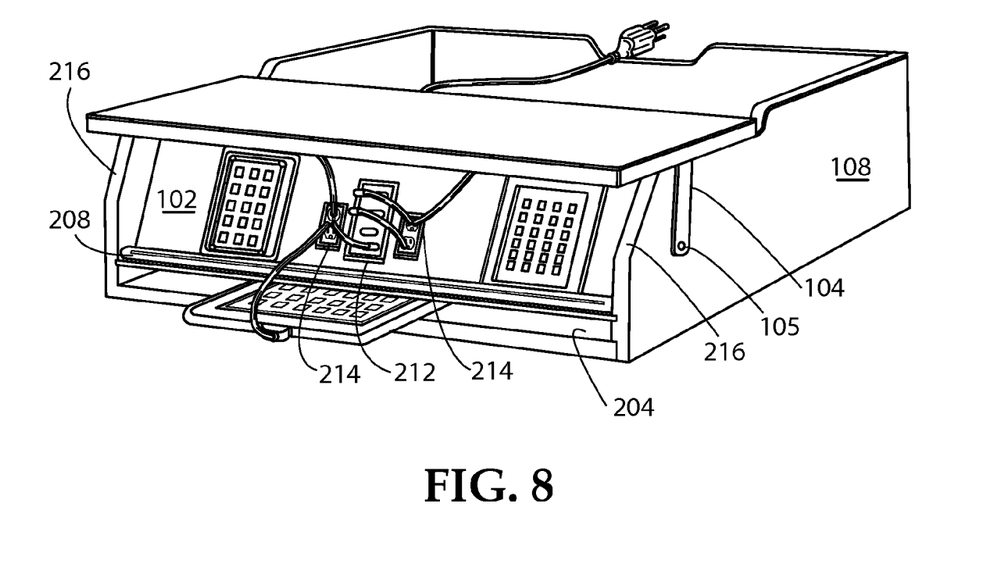
FIG. 8 is an image of a fourth embodiment of the media drawer of the present invention including a display panel.

The outwardly facing side of the panel 200 may be covered in felt or another suitable material to prevent the panel 200 from scratching the surfaces of the electronic devices. The panel 200 may also include at least one cutout 201, for creating a space wherein charger cords may be managed as they extend to the portion of the drawer 100 behind the panel 200. The cutout 201 can be in any practical shape such as the shape shown in the Figures slots for receiving the cords. In the embodiment shown in FIG. 7, a power strip 206 may be stored in or adhered to the interior of the drawer 100 to receive the charger cords from the devices. The cord for the power strip 206 may then extend out of the rear of the drawer 100 (having a similar cord cutout) to be plugged into a typical wall outlet. In another embodiment, as shown in FIG. 8, the panel 200 may include cutouts for insertion of outlets that are affixed to and become an integral part of the panel 200. Such outlets may include standard electrical outlets (120 V) 212 and/or USB ports 214. Similar to the embodiment shown in FIG. 7, a power cord for the one or more outlets integrally formed in the panel 200 may then extend out of the rear of the drawer 100 to be plugged into a typical wall outlet.

An additional feature of the embodiment shown in FIG. 7 is that the drawer 100 may include a double floor, the first being the stationary floor 204 of the box-like drawer 100 and the second being an adjustable floor 208. Similar to the panel 200, tracks or grooves (210A, 210B) are provided on the interior of the side panels 108 to enable the consumer to removably slide the adjustable floor 208 into the tracks or grooves (210A, 210B) at the desired height. The space created between the stationary floor 204 and the adjustable floor 208 may be used to store larger electronic devices such as tablets and laptops.

It is noted that the media drawer of the present invention is not limited to use in connection with a dresser or nightstand. Rather, the media drawer can be used in connection with any case piece of furniture. The dual functionality of the present invention makes it desirable for use in many types of furniture.

In summary, the media drawer system 100 of the present invention is able to transition between serving as (1) a functional, enclosed storage drawer that may be extended away from and retracted into the case piece of furniture, or (2) an open cavity for storing electronic components and devices. In all of the embodiments described above, when the drawer front 102 is receded in the case piece, no portion of the door front 102 protrudes from the case piece that could cause safety concerns. Additionally, the hidden drawer front 102 is aesthetically pleasing. The convertible media drawer of the present also provides a manufacturing efficiency because the same case piece of furniture can be marketed to consumers who desire to store electronic components in the case piece and consumers who desire to only use the case piece for typical enclosed drawer storage.

What is claimed is:

1. A media drawer for a case piece of furniture, the media drawer comprising:
   a drawer front for the media drawer, the media drawer configured to mate with the case piece of furniture by being horizontally extensible away from and retractable into the case piece of furniture, the case piece of furniture selected from the group consisting of a bedroom dresser, a nightstand, an entertainment center, and a television console;
   a first drawer side and a second drawer side, the first drawer side and the second drawer side having a front portion, a raised portion, and a recessed portion;
   a drawer bottom disposed between the first drawer side and the second drawer side;
   a first bracket affixed on one end to the drawer front and affixed on a second opposing end to the first drawer side, the first bracket has a first pivot point on the first drawer side; and
   a second bracket affixed on one end to the drawer front and affixed on a second opposing end to the second drawer side, the second bracket has a second pivot point on the second drawer side; and
   the first pivot point and the second pivot point being located below a vertical midpoint of each of the first drawer side and second drawer side, respectively, when the drawer front is placed in an enclosed position; and
   a display panel that is vertically angled and disposed between the drawer bottom and a top of the media drawer, the display panel includes at least one cutout for positioning cords associated with electronic devices that may be displayed on the display panel; and a vertically adjustable floor that rests in a substantially horizontal plane above the drawer bottom and below the display panel to form an open cavity between the drawer bottom and the adjustable floor; and wherein the drawer front rests in a substantially vertical plane facing outward when in the enclosed position; and wherein the drawer front is configured to transition from the enclosed position to a receded position by rotating up such that the drawer front rests in a substantially horizontal plane and is seated in the recessed portion on top of the first drawer side and the second drawer side such that no portion of the drawer front protrudes above a top of the raised portion of the first drawer side or the second drawer side;

the first bracket and the second bracket configured to rotate about the first pivot point and second pivot point, respectively, to enable the drawer front to be repositioned from the enclosed position to the receded position.

2. The media drawer of claim 1 wherein a top corner of each of the first drawer side and second drawer side closest to the drawer front is rounded.

3. The media drawer of claim 1 wherein the first bracket and second bracket are L-brackets.

4. The media drawer of claim 1 further comprising:
a first pin corresponding with the first pivot point for the first bracket on the first drawer side;
a second pin corresponding with the second pivot point for the second bracket on the second drawer side;
a first sliding track on the first drawer side;
a second sliding track on the second drawer side;
wherein when the drawer front is transitioned from the enclosed position to the receded position, the first pin and second pin slide up the first sliding track and second sliding track, respectively, such that the drawer front rests in a substantially horizontal plane on top of the first drawer side and the second drawer side.

5. The media drawer of claim 4 wherein the first sliding track and the second sliding track are in the shape of an inverted "L".

6. The media drawer of claim 1 wherein the first drawer side includes a first panel track and the second drawer side includes a second panel track such that the display panel may be removably inserted in and held in position by the first panel track and the second panel track.

7. The media drawer of claim 1 wherein a power strip is affixed to an interior of the media drawer behind the display panel.

8. The media drawer of claim 1 wherein the display panel comprises at least one outlet.

9. The media drawer of claim 8 wherein the at least one outlet is selected from the group consisting of a standard 120 V electrical port and a USB port.

10. The media drawer of claim 1 wherein the first drawer side and the second drawer side include at least one set of floor tracks that are configured to removably receive and hold in position the adjustable floor.

11. The media drawer of claim 10 further comprising a display panel that is vertically angled between the adjustable floor and a top of the media drawer.

12. A case piece of furniture, the furniture comprising:
a media drawer having a drawer front, the media drawer configured to extensibly and retractably mate with the case piece of furniture, the case piece of furniture selected from the group consisting of a bedroom dresser, a nightstand, an entertainment center, and a television console, the drawer front having an open position and a closed position;

a first drawer side and a second drawer side, the first drawer side and the second drawer side having a front portion, a raised portion, and a recessed portion, the recessed portion configured to receive the drawer front when the drawer front is placed in the open position;

a drawer bottom disposed between the first drawer side and the second drawer side;

a first bracket affixed on one end to the drawer front and affixed on a second opposing end to the first drawer side, the first bracket has a first pivot point on the first drawer side; and a second bracket affixed on one end to the drawer front and affixed on a second opposing end to the second drawer side, the second bracket has a second pivot point on the second drawer side; and the first pivot point and the second pivot point being located below a vertical midpoint of each of the first drawer side and second drawer side, respectively; and a display panel that is vertically angled and disposed between the drawer bottom and a top of the media drawer, the display panel includes at least one cutout for positioning cords associated with electronic devices that may be displayed on the display panel; and a vertically adjustable floor that rests in a substantially horizontal plane above the drawer bottom and below the display panel to form an open cavity between the drawer bottom and the adjustable floor; and wherein in the closed position the drawer front rests in a substantially vertical plane; and wherein in the open position the drawer front rests in a substantially horizontal plane and is received by the recessed portion on top of the first drawer side and the second drawer side, such that no portion of the drawer front protrudes above the top of the raised portion of the first drawer side or the second drawer side, and no portion of the drawer front protrudes from the case piece of furniture; and wherein the drawer front is configured to transition from the closed position to the open position by rotating about the first pivot point and second pivot point, respectively, to enable the drawer front to be repositioned from the closed position to the open position.

13. The media drawer of claim 12 wherein a top corner of each of the first drawer side and second drawer side closest to the drawer front is rounded.

14. The media drawer of claim 12 wherein the first drawer side and the second drawer side include at least one set of floor tracks that are configured to removably receive and hold in position the adjustable floor.

* * * * *